(12) United States Patent
Orlowski et al.

(10) Patent No.: US 7,939,412 B2
(45) Date of Patent: May 10, 2011

(54) PROCESS FOR FORMING AN ELECTRONIC DEVICE INCLUDING A FIN-TYPE TRANSISTOR STRUCTURE

(75) Inventors: Marius K. Orlowski, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/753,226

(22) Filed: Apr. 2, 2010

(65) Prior Publication Data

US 2010/0190308 A1  Jul. 29, 2010

Related U.S. Application Data

(62) Division of application No. 11/328,594, filed on Jan. 10, 2006, now Pat. No. 7,723,805.

(51) Int. Cl.
*H01L 21/336* (2006.01)

(52) U.S. Cl. . 438/284; 438/311; 257/347; 257/E21.426; 257/E21.618

(58) Field of Classification Search .......... 257/347, 257/401, E21.193, E21.426, E21.562, E21.571, 257/E21.618; 438/284, 311
See application file for complete search history.

(56) References Cited

U.S. PATENT DOCUMENTS

| | | | |
|---|---|---|---|
| 4,701,423 A | 10/1987 | Szluk | |
| 5,384,473 A | 1/1995 | Yoshikawa et al. | |
| 6,166,413 A | 12/2000 | Ono | |
| 6,765,303 B1 | 7/2004 | Krivokapic et al. | |
| 6,815,277 B2 | 11/2004 | Fried et al. | |
| 6,867,460 B1 | 3/2005 | Anderson et al. | |
| 6,909,147 B2 | 6/2005 | Aller et al. | |
| 6,987,289 B2 | 1/2006 | Nowak | |
| 6,992,354 B2 | 1/2006 | Nowak et al. | |
| 7,045,401 B2 * | 5/2006 | Lee et al. | 438/157 |
| 7,074,662 B2 | 7/2006 | Lee et al. | |
| 7,112,455 B2 | 9/2006 | Mathew et al. | |
| 7,214,576 B1 | 5/2007 | Kaneko et al. | |
| 7,224,029 B2 * | 5/2007 | Anderson et al. | 257/347 |
| 7,244,029 B2 | 7/2007 | Anderson | |
| 7,382,020 B2 | 6/2008 | Liu et al. | |
| 7,575,975 B2 | 8/2009 | Thean et al. | |
| 7,709,303 B2 | 5/2010 | Burnett et al. | |
| 2004/0113207 A1 | 6/2004 | Hsu et al. | |
| 2004/0222477 A1 | 11/2004 | Aller et al. | |
| 2005/0184316 A1 * | 8/2005 | Kim et al. | 257/213 |
| 2005/0239242 A1 | 10/2005 | Zhu et al. | |
| 2006/0068531 A1 | 3/2006 | Breitwisch et al. | |
| 2006/0113522 A1 * | 6/2006 | Lee et al. | 257/18 |

(Continued)

OTHER PUBLICATIONS

U.S. Appl. No. 12/785,829, filed May 24, 2010, entitled "Integrated Circuit Using Finfets and Having a Static Random Access Memory (SRAM)".

Doris et al., "A Simplified Hybrid Orientation Technology (SHOT) for High Performance CMOS," 2004 IEEE Symposium on VLSI Technology Digest of Technical Papers, pp. 86-87.

Yang et al., "On the Integration of CMOS with Hybrid Crystal Orientations," 2004 IEEE Symposium on VLSI Technology Digest of Technical Papers, pp. 160-161.

(Continued)

*Primary Examiner* — Khiem D Nguyen (57) ABSTRACT

An electronic device can include an insulating layer and a fin-type transistor structure. The fin-type structure can have a semiconductor fin and a gate electrode spaced apart from each other. A dielectric layer and a spacer structure can lie between the semiconductor fin and the gate electrode. The semiconductor fin can include channel region including a portion associated with a relatively higher $V_T$ lying between a portion associated with a relatively lower $V_T$ and the insulating layer. In one embodiment, the supply voltage is lower than the relatively higher $V_T$ of the channel region. A process for forming the electronic device is also disclosed.

20 Claims, 4 Drawing Sheets

U.S. PATENT DOCUMENTS

2006/0151834 A1    7/2006  Anderson et al.
2006/0177977 A1*   8/2006  Chan et al. .................... 438/238
2007/0093010 A1    4/2007  Mathew et al.
2007/0158764 A1    7/2007  Burnett et al.
2007/0269950 A1*  11/2007  Anderson et al. ............. 438/285

OTHER PUBLICATIONS

Non-Final Office Action mailed Dec. 29, 2010 for U.S. Appl. No. 12/785,829, 15 pages.

* cited by examiner

FIG. 10

PROCESS FOR FORMING AN ELECTRONIC DEVICE INCLUDING A FIN-TYPE TRANSISTOR STRUCTURE

CROSS-REFERENCE TO RELATED APPLICATIONS

The present application is a divisional of U.S. patent application 11/328,594 entitled "Electronic Device Including a Fin-Type Structure and a Process for Forming the Electronic Device," filed on Jan. 10, 2006, now issued as U.S. Pat. No. 7,723,805, which is hereby incorporated herein by reference in its entirety. The present application is related to pending U.S. patent application No. 12/785,829, entitled "INTEGRATED CIRCUIT USING FINFETS AND HAVING A STATIC RANDOM ACCESS MEMORY (SRAM)" filed on May 24, 2010.

BACKGROUND

1. Field of the Disclosure

The present disclosure relates to electronic devices, and more particularly to electronic devices that include fin-type transistor structures.

2. Description of the Related Art

Fin-type field effect transistors ("FinFET") formed on a common substrate typically have electrical channel widths that are in increments of substantially even, integer multiples of the fixed height of the semiconductor fin(s) of the FinFET. Being limited to using FinFETs having channel widths limited in this manner can be problematic when "tuning" designs to obtain operational characteristics that assure operation across a desired set of operating parameters. Therefore, it would be desirable to have FinFETs with a greater range of available channel widths.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DESCRIPTION OF THE PREFERRED EMBODIMENT(S)

In accordance with the present disclosure, a fin-type transistor structure is formed having a channel region that is effectively limited to only a portion of a semiconductor fin of the fin-type transistor for a specific operating voltage. In accordance with a specific embodiment, a sidewall structure spaces a portion of a gate electrode sufficiently far from the semiconductor fin to make the $V_T$ of a corresponding portion of the channel region higher than $V_{SS}$, thus preventing inversion of that portion of the channel region during operation. By forming sidewall structures that extend to different heights from the substrate surface for different transistors, the effective size of a FinFET channel region can be adjusted for a specific operating voltage without adjusting the physical size of the semiconductor fin. Specific embodiments of the present disclosure will be better understood with reference to FIGS. 1-10.

Figure 1:
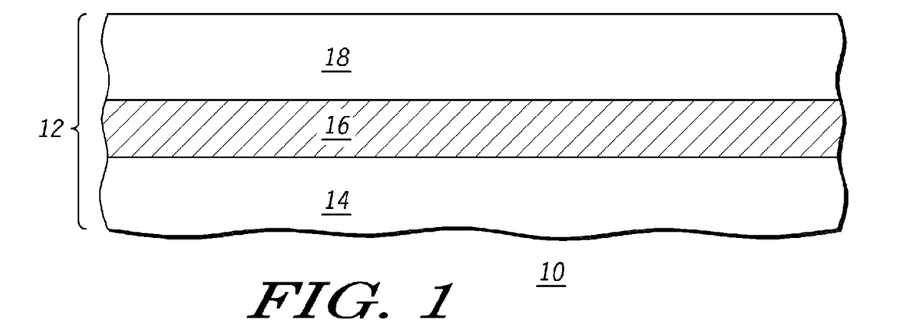
FIG. 1 includes an illustration of a workpiece where electronic components of an electronic device can subsequently be formed.

FIG. 1 includes an illustration of a cross-sectional view of a portion of a substrate 12 at a location of workpiece 10 where fin-type transistors can subsequently be formed. In the illustrated embodiment, substrate 12 is a semiconductor-on-insulator ("SOI") substrate that includes layers 14, 16 and, 18. In the illustrated embodiment, layer 14 can be a support layer and provide mechanical support for the other layers of the substrate. Layer 16 can be a buried insulating layer and provide electrical insulation between layer 14 and layer 18. Layer 18 can be a semiconductor layer and can include a semiconductor element such as silicon, germanium, or the like and has a substantially uniform thickness in a range of approximately 50 to approximately 150 nm when measured in a direction substantially perpendicular to a major surface of workpiece 10. In one embodiment, layer 18 can include an n-type active semiconductor region, a p-type active semiconductor region or any combination thereof. The channel region can be doped either before or after the subsequent formation of a semiconductor fin. In one embodiment, the channel doping can be in a range of approximately 1E18 to approximately 6E18 atoms per cubic centimeter. In a specific embodiment, the channel doping can have a level of approximately 3 E18 atoms per cubic centimeter. In other embodiments the fin may be also undoped or lightly doped (in a range of approximately 1E15 to approximately 1E17 atoms per cubic centimeter).

It will be appreciated that that while substrate 12 is illustrated as an SOI substrate, other substrates could be utilized, such as a monocrystalline semiconductor wafer, or the like, that provide the ability to form semiconductor fins for FinFET transistors as described herein.

Figure 2:
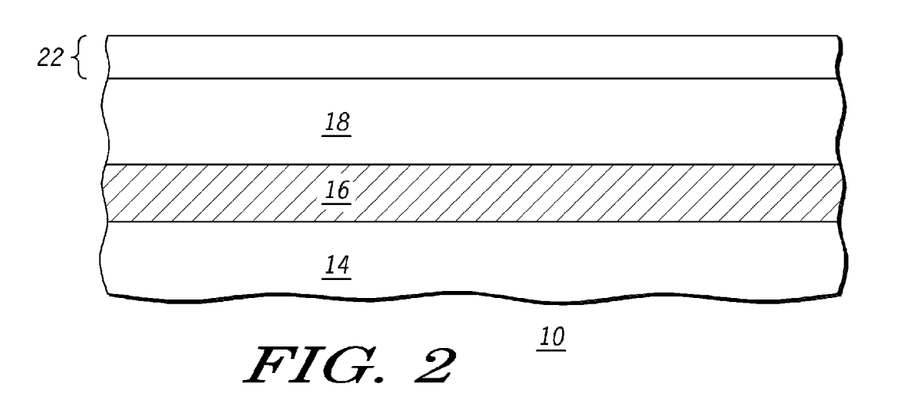
FIG. 2 includes an illustration of the workpiece of FIG. 1 after formation of a layer that can serve as a hard mask.

FIG. 2 includes an illustration of a cross-sectional view of workpiece 10 after formation of layer 22. In one embodiment, layer 22 can be used as a hard mask to protect portions of layer 18 from subsequent etches. The material of layer 22 is typically selected such that an etch process designed to remove exposed portions of layer 18 will remove exposed portions of layer 22 at a slower rate or not at all. Layer 22 can include an oxide, a nitride, an oxynitride, another material resistant to an etch process for removing layer 18, and the like, or any combination thereof. Layer 22 can have a thickness in a range of approximately 10 nm to approximately 100 nm and be grown or deposited by a conventional or proprietary process. In one embodiment, layer 22 can include a plurality of layers.

Figure 3:
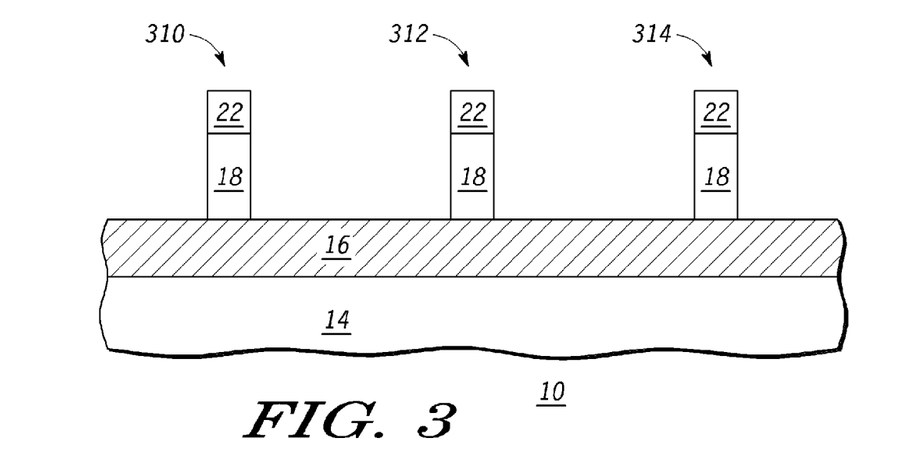
FIG. 3 includes an illustration of the workpiece of FIG. 2 after formation of semiconductor fins.

FIG. 3 includes an illustration of a cross-sectional view of workpiece 10 subsequent to removal of portions of layer 18, where the portions of layer 22 at locations 310, 312, and 314 form a hard mask. In the illustrated embodiment, the hard mask is formed from layer 22 by conventional or proprietary process, which can include lithographic or etch techniques, such that portions of layer 22 remain overlying layer 18 at locations 310, 312, and 314. An exposed portion of layer 18 is removed using an etch process to expose a portion of the underlying layer 16. A portion of layer 18 underlying remaining portions of layer 22 can form a semiconductor fin. The "height" of a semiconductor fin can have substantially the same value as the "thickness" of the previously formed layer 18. Note the term "height" is understood herein to refer to a distance measured in a direction substantially perpendicular to a major surface of substrate 12. In the illustrated embodiment, a semiconductor fin at location 312 can be associated with an n-channel FinFET, while semiconductor fins at locations 310 and 314 can be associated with a p-channel FinFETs. In one embodiment, the remaining portion of layer 22 overlying a semiconductor fin can comprise a cap portion of subsequently formed fin-type transistor. Optionally, active semiconductor regions can be doped to previously described levels after formation of the semiconductor fins.

Figure 4:
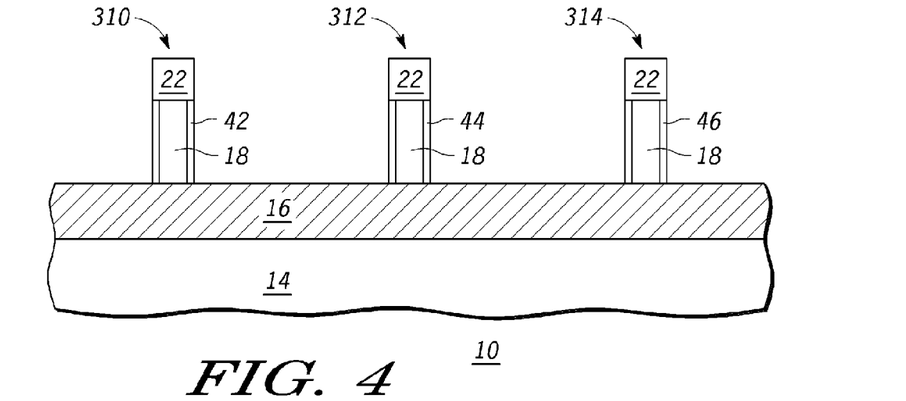
FIG. 4 includes an illustration of the workpiece of FIG. 3 after formation of a layer that can serve as a gate dielectric.

FIG. 4 includes an illustration of a cross-sectional view of workpiece 10 of FIG. 3 after formation of layers 42, 44, and, 46 along the walls of semiconductor fins at locations 310, 312, and 314, respectively. In the illustrated embodiment, layers 42, 44, and, 46 can be dielectric layer a portion of which can serve as a gate dielectric for transistor structures formed at locations 310, 312, and 314. Layer 42 can include a dielectric material such as silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. As illustrated, layer 42 may be thermally grown using an oxidizing or nitridizing ambient using a conventional or proprietary process. In other embodiments layer 42 can be deposited using a conventional or proprietary chemical vapor deposition ("CVD") technique, physical vapor deposition ("PVD") technique, atomic layer deposition (ALD) or a combination thereof. In such a case, additional processing such as masking and etch steps may be used to remove portions of layer 42 overlying the workpiece 10 at locations other than those illustrated. Layer 42 can have a thickness in a range of approximately 1 to approximately 25 nm. In a particular embodiment, layer 42 can serve as a screening layer to help reduce channeling during a doping implant process. As compared to layer 42, layers 44 and 46 can each have the same or different materials, be formed at the same or different time, have the same or a different thickness, or any combination thereof.

Figure 5:
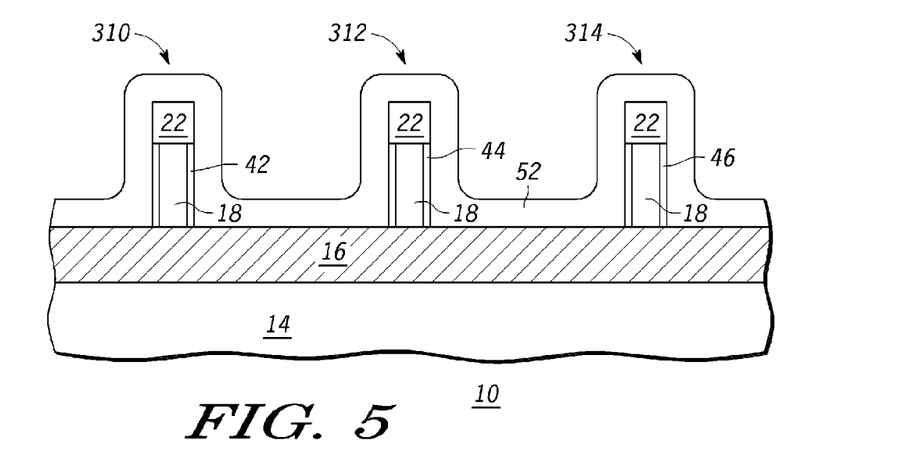
FIG. 5 includes an illustration of the workpiece of FIG. 4 after formation of layer from which sidewall structures can be formed.

FIG. 5 includes an illustration of a cross-sectional view of workpiece 10 after formation of a layer 52. In accordance with a specific embodiment, a portion of layer 52 can subsequently form a sidewall structure. In one embodiment, layer 52 can have a faster etch rate than the hard mask previously formed from layer 22 such that the hard mask can protect the semiconductor fin during the spacer formation process. In one embodiment, layer 52 may include an oxide, a nitride, an oxynitride, a suitable insulating material, or any combination thereof. Layer 52 may or may not be substantially conformal and can have a thickness in a range of approximately 10 to approximately 50 nm. Layer 52 can be grown or deposited using a conventional or proprietary technique.

Figure 6:
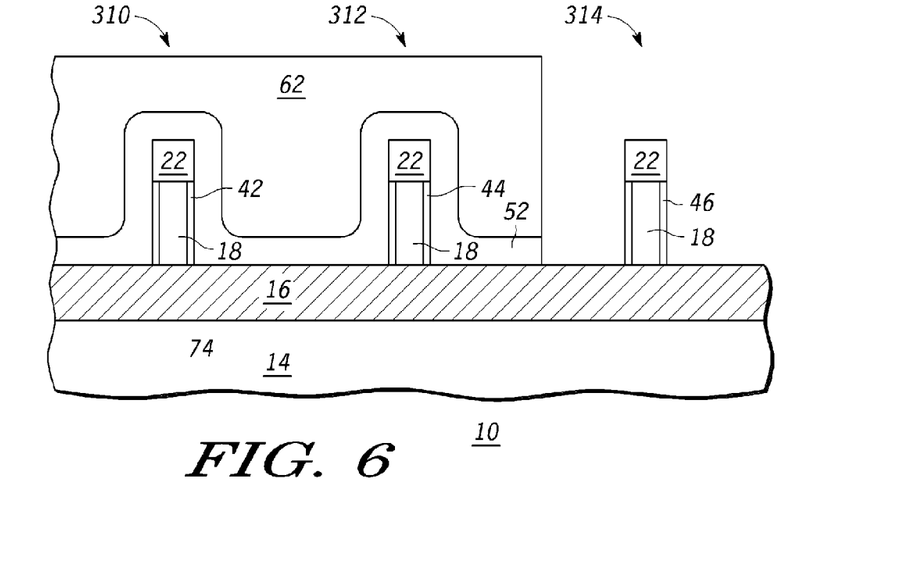
FIG. 6 includes an illustration of the workpiece of FIG. 5 after removal of a portion of the layer.

FIG. 6 includes an illustration of a cross-sectional view of workpiece 10 after formation of a pattern layer 62 and removal of an exposed portion of layer 52 at location 314. Pattern layer 62 can be formed over workpiece 10 by a conventional or proprietary lithographic process. Pattern layer 62 is illustrated in the particular embodiment of FIG. 6 to overlie locations 310 and 312 of workpiece 10 to protect those locations during processing at location 314. An exposed portion of layer 52 can be removed using conventional or proprietary process. The height dimension of the semiconductor fin at location 314 is substantially the same as previously described. The remaining portion of patterned layer 62 can then be removed from workpiece 10.

Figure 7:
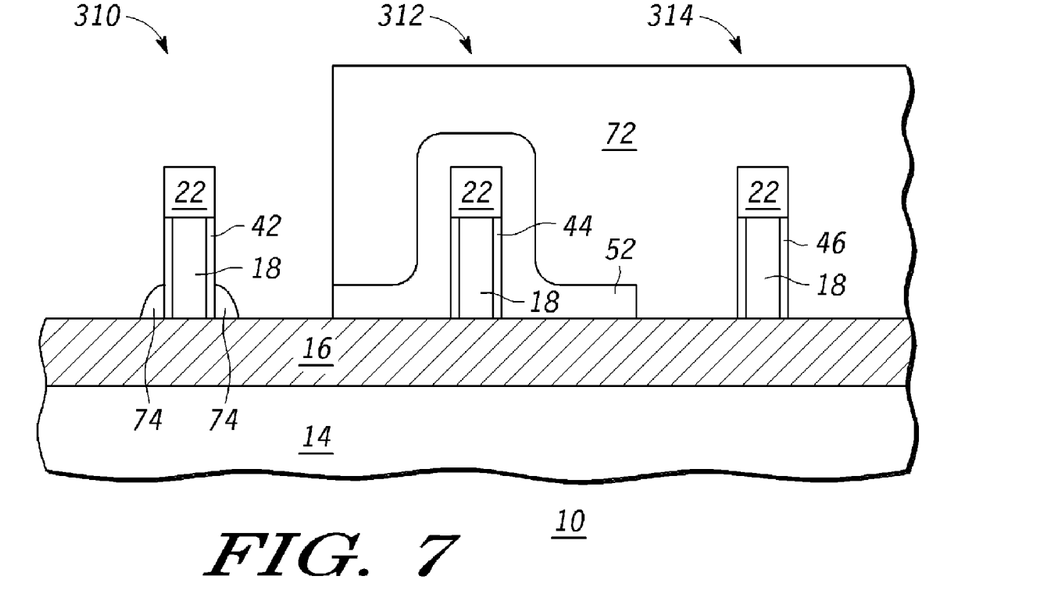
FIG. 7 includes an illustration of the workpiece of FIG. 6 after formation of a sidewall structure at a first location.

FIG. 7 includes an illustration of a cross-section of the workpiece 10 viewed along a channel length direction at location 310, after formation of pattern layer 72 and removal of a portion of layer 52 at location 310. Patterned layer 72 can be formed over workpiece 10 by a conventional or proprietary lithographic process. Pattern layer 72 is illustrated in the particular embodiment of FIG. 7 to overlie locations 312 and 314 of workpiece 10 to protect those locations during processing at location 310. An exposed portion of layer 52 can then be removed using a conventional or proprietary process to form sidewall structure 74. The height of sidewall structure 74 is smaller then the height of the semiconductor fin at location 310. In one embodiment, at location 310, the height of the sidewall structure is in a range of approximately one tenth to approximately three quarters of the semiconductor fin. The height of the semiconductor fin at location 310 is substantially unchanged from before. The remaining portion of patterned layer 72 can then be removed from workpiece 10.

In a particular embodiment, sidewall structures 74 can have substantially rectangular shape when viewed in cross-section along the channel length direction. In other embodiments, other shapes, such as substantially triangular, or half parabola are formed. The equivalent oxide thickness of the sidewall structure 74 should be not less than approximately five times the equivalent oxide thickness of layer 42. Note herein, the term "equivalent oxide thickness" is intended to mean the thickness an imaginary layer of silicon dioxide would have in order to generate the same electrical isolation properties as the existing layer. "Equivalent oxide thickness" is used to account for possible differences in materials between layer 42 and sidewall structure 74. In one embodiment, the semiconductor fin can receive an implant, i.e. a halo implant, such that the portion between sidewall structures 74 can have a doping concentration in a range of approximately 1E18 to 6E18 atoms per $cm^3$.

Figure 8:
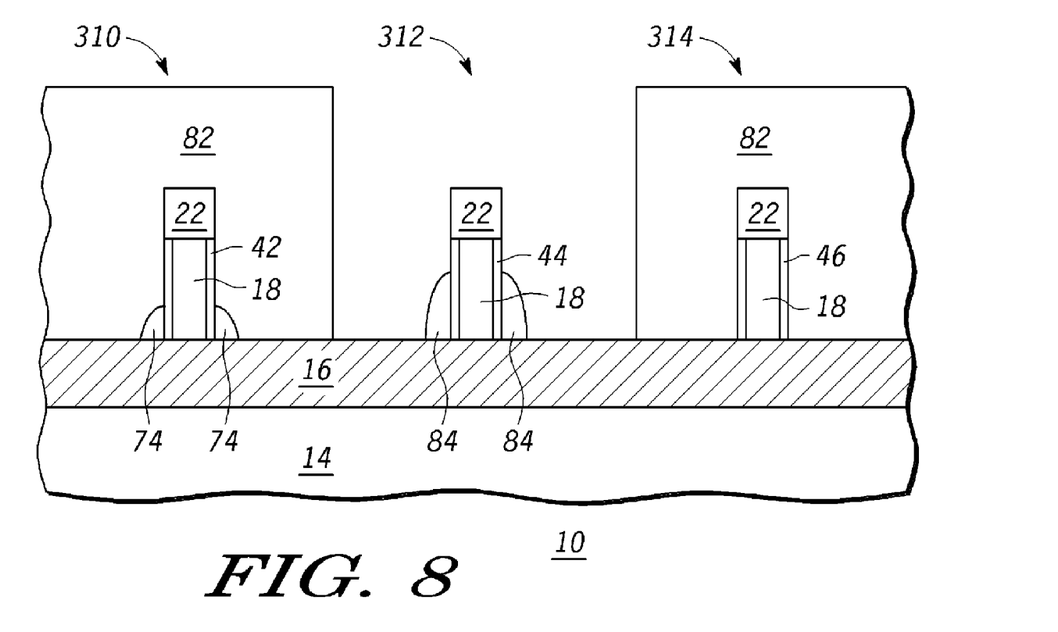
FIG. 8 includes an illustration of the workpiece of FIG. 7 after formation of a sidewall structure at a second location.

FIG. 8 includes an illustration of a cross-sectional view of the workpiece 10 along a channel length direction at location 312, after formation of pattern layer 82 and removal of a portion of layer 52 at location 312. Patterned layer 82 can be formed over workpiece 10 by a conventional or proprietary lithographic process. Pattern layer 82 is illustrated in the particular embodiment of FIG. 8 to overlie locations 310 and 314 of workpiece 10 to protect those locations during processing at location 312. An exposed portion of layer 52 can then be removed using a conventional or proprietary process to form sidewall structure 84. Sidewall structure 84 can have a size, a shape, or combination thereof, the same or different from sidewall structure 72. The height of sidewall structure 84 is less than the height of the semiconductor fin at location 312 and greater than the corresponding dimension of fin sidewall spacer 74. In the illustrated embodiment, at location 312, the height of the sidewall structure is in a range of approximately one tenth to approximately three quarters of the height of the semiconductor fin. The height of the semiconductor fin at location 312 is substantially unchanged from before. In a particular embodiment, when compared to sidewall structure 74, sidewall structure 84 can be formed at the same or different time, have the same or a different thickness. The remaining portion of patterned layer 82 can then be removed from workpiece 10.

In a particular embodiment, sidewall structures 84 can have substantially rectangular shape when viewed in cross-section. The equivalent oxide thickness of the sidewall structure 84 should be not less than approximately five times the equivalent oxide thickness of layer 44. In one embodiment, a portion of the semiconductor fin between sidewall structures 84 can have a doping concentration in a range of approximately 1E18 to 6E18 atoms per cm3.

Figure 9:
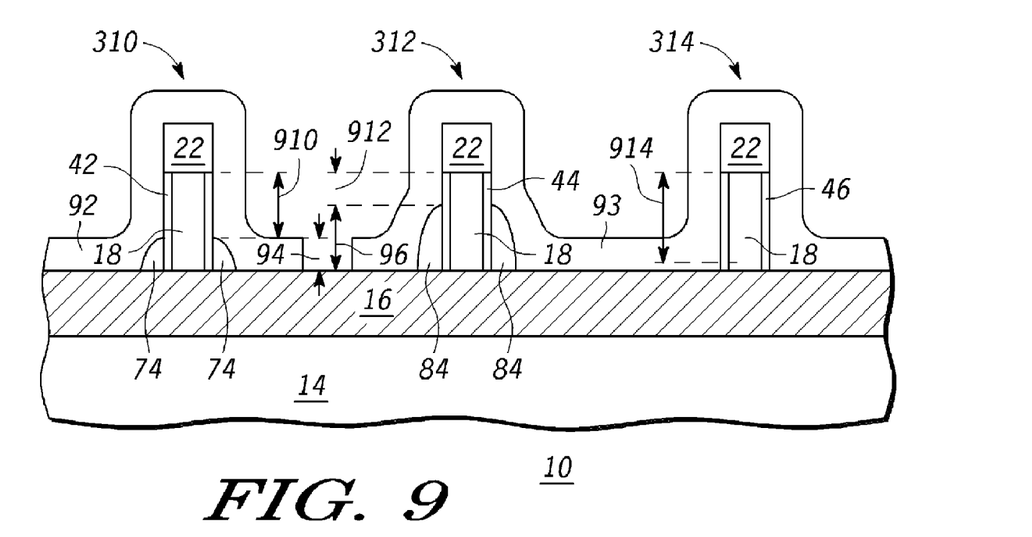
FIG. 9 includes an illustration of the workpiece of FIG. 8 after removal of a portion of a layer to form gate electrodes.

FIG. 9 includes an illustration of a cross-sectional view of the workpiece 10 after formation of fin-type transistor structures at locations 310, 312, and 314 along a direction parallel to a major surface of the substrate. In the illustrated embodiment, each fin-type structure can include the previously formed semiconductor fin and dielectric layer, and one of gate electrodes 92 and 93. At location 310, sidewall structure 74 lies between gate electrode 92 and the semiconductor fin. At location 312, sidewall structure 84 lies between gate electrode 93 and the semiconductor fin. In accordance with one embodiment, a conductive layer suitable for forming gate electrodes 92 and 93 can be formed over workpiece 10. The conductive layer can include one or more semiconductor-containing or metal-containing materials. In one embodiment, the conductive layer includes polysilicon or amorphous silicon deposited by a chemical vapor deposition process. In another embodiment, the conductive layer may include one or more other materials or may be deposited by another process. In one particular embodiment, the conductive layer is doped when deposited, and in another particular embodiment, is doped after it is deposited. In one embodiment, the thickness of the conductive layer is in a range of approximately 50 to approximately 500 nm, and in a finished device, remaining portions of the conductive layer have a dopant concentration of at least approximately 1E19 atoms/cm3 when the conductive layer includes polysilicon or amorphous silicon.

The conductive layer constituting the gate electrode may include a plurality of layers. The bottom layer of the electrode stack determines the work function of the gate electrode and thus affects the threshold voltage of the transistor. The bottom layer can be a metal carbide such as TaC, or a metal nitride such as TiN, or a silicide such as NiSi, or any other suitable metallic conductor. The rest of the gate electrode may be made of doped polysilicon, a metal silicide or any other suitable conductor. The conductive layer can be patterned using a conventional or proprietary lithographic process (not illustrated) and exposed portions can be removed to form separate gate electrodes 92 and 93.

Semiconductor fins at locations 310, 312, and 314 can each include a channel region. $V_T$ for the channel region is at least partially determined by the effective distance gate electrodes 92 and 93 are spaced apart from the fin structures formed from layer 18, where the effective distance is based upon the actual distance and the dielectric constant of the material within that space. Therefore, in one embodiment, at location 310, semiconductor fin portion at location 94, lying between spacer structure portions 74, can have a relatively higher $V_T$ than the semiconductor fin portion at location 910 of the same semiconductor fin. Similarly, at location 312, semiconductor fin portion at location 96, lying between spacer structure portions 84, can have a relatively higher $V_T$ than semiconductor fin portion at location 912 of the same semiconductor fin. At location 314, substantially all of the channel region of the semiconductor fin has a $V_T$ closer in value to the $V_T$s of locations 910 and 912 than the $V_T$s at locations 94 and 96. In a particular embodiment, the $V_T$ for the channel regions at locations 94 and 96 can be higher than the supply voltage (i.e. the operating voltage) such that during operation only portions at locations 910, 912, and 914 can be turned on, creating channel regions with different effective widths within semiconductor fins of substantially the same height at location 310, 312, and 314. In the illustrated embodiment, the effective channel width at location 910 has a value between the effective channel width at location 312 and location 314. In one embodiment, at location 910, substantially only layer 42 lies between gate electrode 92 and the semiconductor fin portion. Similarly, at location 912, substantially only layer 44 lies between gate electrode 94 and the semiconductor fin portion.

Figure 10:
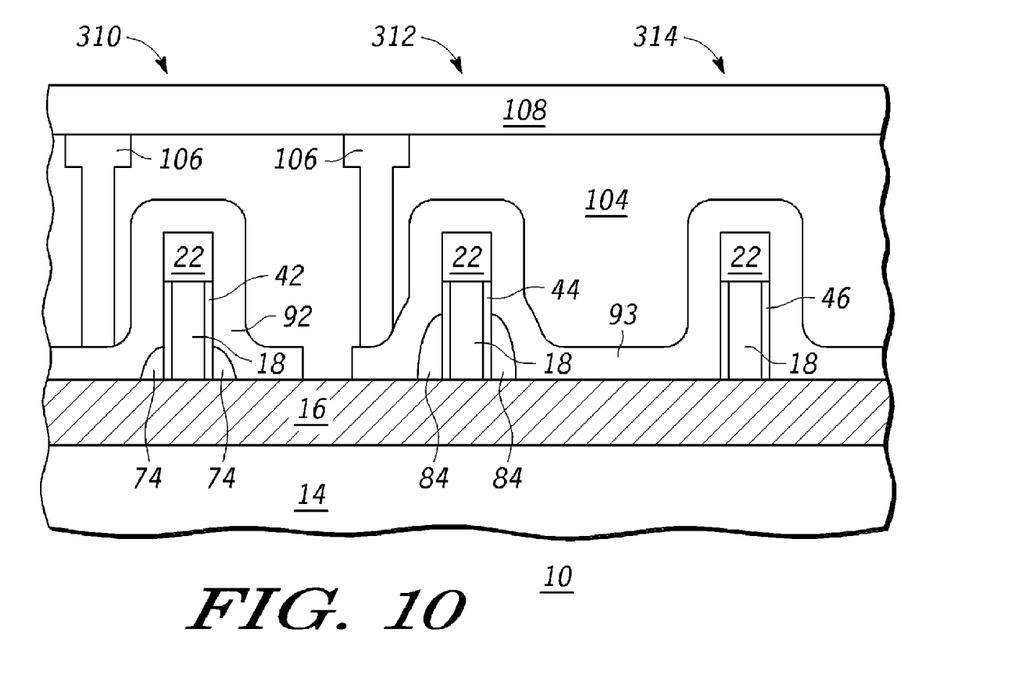
FIG. 10 includes an illustration of a substantially complete electronic device.

FIG. 10 includes an illustration of a cross-sectional view of a substantially completed electronic device. Location 310 includes a fin-type transistor (FinFET) that includes a fin structure, sidewall structures 74 and a gate electrode 92. The fin structure at location 310 includes the semiconductor fin formed from layer 18, a layer 42, and a cap portion remaining from layer 22. Location 312 includes a fin-type transistor (FinFET) that includes a fin structure, sidewall structures 84 and a gate electrode 93. The fin structure at location 312 includes the semiconductor fin formed from layer 18, a layer 44, and a cap portion remaining from layer 22. Location 314 includes a fin-type transistor (FinFET) that includes a fin structure and a gate electrode 93. The fin structure at location 314 includes the semiconductor fin formed from layer 18, a layer 46, and a cap portion remaining from layer 22. One or more source regions, drain regions, source/drain regions or any combination thereof can be formed using a conventional or proprietary process. One or more insulating layers 104, one or more conductive layers 106, and one or more encapsulating layers 108 are formed using one or more conventional or proprietary techniques.

Some terms are defined or clarified as to their intended meaning as they are used within this specification.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include, a first fin-type transistor structure further including, a first semiconductor fin overlying an insulating layer and including a channel region, the first semiconductor fin having a first portion and a second portion, the first portion lying between the second portion and the insulating layer. The electronic device can also include a first gate electrode, spaced apart from and adjacent to the first semiconductor fin, a first layer lying between the first gate electrode and the first semiconductor fin, and a first spacer structure, lying between the first gate electrode and the first portion of the first semiconductor fin, wherein at least a part of the second portion of the first semiconductor fin extends beyond the height of the first spacer structure.

In an embodiment of the first aspect, the first insulating layer includes a buried insulating layer of a semiconductor-on-insulator substrate. In another embodiment, the first layer includes a dielectric material. In still another embodiment, the spacer structure includes an insulating material. In yet another embodiment, in a cross-section viewed along a channel length direction, the spacer structure has a substantially rectangular shape.

In another embodiment of the first aspect, the first fin-type transistor structure further includes a cap portion overlying the semiconductor fin. In still another embodiment of the first aspect, when viewed in a direction parallel to the major surface of the substrate, substantially only the first layer lies between the second portion of the semiconductor fin and the gate electrode. In yet another embodiment of the first aspect, the electronic device can further include, a second fin-type transistor structure including, a second semiconductor fin overlying the insulating layer and including a channel region, the second semiconductor fin having a third portion and a fourth portion, the third portion lying between a fourth portion and the dielectric layer. The electronic device can also further include a second gate electrode, spaced apart from and adjacent to the second semiconductor fin, and a second layer lying between the second gate electrode and the second semiconductor fin.

In a particular embodiment of the first aspect, the first fin-type transistor structure includes a p-doped channel region and the second fin-type transistor structure includes an n-doped-doped channel region. In another particular embodiment, the height of the first semiconductor fin and the height of the second semiconductor are substantially the same. In a more particular embodiment, the effective channel width of the first fin-type transistor structure is less than the effective channel width of the second fin-type transistor structure.

In another particular embodiment of the first aspect, the electronic device can further include a second spacer structure, lying between the second gate electrode and the third portion of semiconductor fin, wherein at least part of the fourth portion of the semiconductor fin extends beyond the height of the second spacer structure. In a more particular embodiment, the height of the first spacer structure is larger than the height of the second spacer structure. In a still more particular embodiment, the effective channel width of the first fin-type transistor structure is smaller than the effective channel width of the second fin-type transistor structure. In another more particular embodiment, the first and second fin-type transistor structures include channel regions of opposite conductivity types.

In a second aspect, an electronic device can include, a first fin-type transistor structure further including, a semiconductor fin overlying an insulating layer and including a channel region, the semiconductor fin having a first portion and a second portion the first portion lying between the second portion and the insulating layer. The first fin type transistor structure further including the first portion of the semiconductor fin including a first portion of the channel region associated with a first $V_T$, and the second portion of the semiconductor fin including a second portion of the channel region associated with a second $V_T$, wherein the first $V_T$ has a higher value than the second $V_T$. The electronic device can also include a gate electrode spaced apart from and adjacent to the first and second portions of the semiconductor fin.

In an embodiment of the second aspect, the first $V_T$ is larger than an operating voltage of the electronic device.

In a third aspect, a process for forming an electronic device can include forming a first fin-type structure including a first semiconductor fin overlying an insulating layer, the first semiconductor fin having a first channel region of a first effective width. The process can also include forming a first sidewall structure adjacent to the first semiconductor fin wherein, the height of the first semiconductor fin is larger than the height of the height of the first sidewall structure, and forming a first gate electrode, wherein the first gate electrode overlies a portion of the first fin-type structure.

In a particular embodiment of the third aspect, the process further including, forming a second fin-type structure including a second semiconductor fin, the second semiconductor fin including a second channel region of a second effective width, the second effective width larger than the first effective width, and forming a second gate electrode, wherein the second gate electrode overlies a portion of the second fin-type structure. In a more particular embodiment, the process further includes forming a second sidewall structure adjacent to the second semiconductor fin wherein, the height of the second semiconductor fin is larger than the height of the second sidewall structure, and the height of the second sidewall structure is larger than the first sidewall structure.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires. For example, the doping of semiconductor fins can occur as described in the discussion with respect to FIGS. 1, 3 or FIG. 9.

In another example, formation or removal of portions of layer 52 at locations 310, 312, and 314 and thus formation of sidewall structures 74 and 84 may occur in any sequential order. Though not illustrated, in a particular embodiment, portions of layer 52 at locations 310 and 312 can be formed at different times, by different processes, and of different materials so that fin spacer structures 74 and 84 in a substantially complete electronic device can have different characteristics. It can also be appreciated that while sidewall structures 74 and 84 can each be continuous structures when initially formed, portions of either or both can be removed in subsequent processing such that, in a substantially complete electronic device, remaining portions of sidewall structures 74 or 84 can be discontinuous. In another example, layer 22 may include a pad layer lying between an etch-resistant portion and the semiconductor fin to reduce interactions between the semiconductor fin and the etch-resistant portion of the layer 22.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a first fin-type structure of an electronic device comprising:
    forming a first semiconductor fin of a first fin-type transistor structure overlying an insulating layer and including a channel region, the channel region of the first semiconductor fin having a first portion and a second portion, the first portion lying between the second portion and the insulating layer, and both the first portion and the second portion having one of a p-type channel doping or an n-type channel doping;
    forming a first gate electrode spaced apart from and adjacent to the first semiconductor fin;
    forming a first layer lying between the first gate electrode and the first semiconductor fin; and
    forming a first spacer structure, lying between the first gate electrode and the first portion, wherein at least part of the second portion extends beyond a height of the first spacer structure.

2. The method of claim 1, wherein the insulating layer comprises a buried insulating layer of a semiconductor-on-insulator substrate.

3. The method of claim 1, wherein the first layer comprises a dielectric material.

4. The method of claim 1, wherein the spacer structure comprises an insulating material.

5. The method of claim 1, wherein, in a cross-section viewed along a channel length direction, the spacer structure has a substantially rectangular shape.

6. The method of claim 1 further comprises forming a cap portion overlying the first semiconductor fin.

7. The method of claim 1, wherein, in a cross-section viewed along a channel length direction, substantially only the first layer lies between the second portion of the first semiconductor fin and the first gate electrode.

8. The method of claim 1 further comprising:
    forming a second semiconductor fin of a second fin-type transistor structure overlying the insulating layer and including a channel region, the channel region of the second semiconductor fin having a third portion and a fourth portion, the third portion lying between the fourth portion and the insulating layer;
    forming a second gate electrode, spaced apart from and adjacent to the second semiconductor fin; and
    forming a second layer lying between the second gate electrode and the second semiconductor fin.

9. The method of claim 8, wherein the first fin-type transistor structure comprises a p-doped channel region and the second fin-type transistor structure comprises an n-doped channel region.

10. The method of claim 8, wherein the height of the first semiconductor fin and the height of the second semiconductor fin are substantially the same.

11. The method of claim 10, wherein an effective channel width of the first fin-type transistor structure is less than an effective channel width of the second fin-type transistor structure.

12. The method of claim 8, further comprising forming a second spacer structure lying between the second gate electrode and the third portion of the channel region of the second semiconductor fin, wherein at least part of the fourth portion of the channel region of the second semiconductor fin extends beyond the height of the second spacer structure.

13. The method of claim 12, wherein, the height of the first spacer structure is larger than the height of the second spacer structure.

14. The method of claim 13, wherein an effective channel width of the first fin-type transistor structure is smaller than an effective channel width of the second fin-type transistor structure.

15. The method of claim 12, wherein the first and second fin-type transistor structures comprise channel regions of opposite conductivity types.

16. A method of forming an electronic device comprising:
    forming a first semiconductor fin of a first fin-type transistor structure overlying an insulating layer and including a channel region that includes a first portion and a second portion, the first portion lying between the second portion and the insulating layer, and both the first portion and the second portion of the channel region having one of a p-type channel doping or an n-type channel doping; and
    forming a first gate electrode spaced apart from and adjacent to the first and second portions of the channel region, the first gate electrode spaced apart from the first portion of the channel region by an amount greater than the first gate electrode is spaced apart from the second portion of the channel region, wherein the first portion of the channel has a greater $V_T$ than the second portion of the channel.

17. The method of claim 16, wherein the first $V_T$ is larger than an operating voltage of the electronic device.

18. The method of claim 16 further comprising:

forming a second semiconductor fin of a second fin-type transistor structure overlying the insulating layer and including a channel region that includes a third portion and a fourth portion, the third portion lying between the fourth portion and the insulating layer, and both the third portion and the fourth portion of the channel region having one of a p-type channel doping or an n-type channel doping;

forming a second gate electrode spaced apart from and adjacent to the third and fourth portions of the channel region, the second gate electrode spaced apart from the third portion of the channel region by an amount greater than the second gate electrode is spaced apart from the fourth portion of the channel region.

19. The method of claim 18, wherein the first and second portion of the channel region of the first fin-type transistor structure comprises a p-doped region, and the third and fourth channel region of the second fin-type transistor structure comprises an n-doped region.

20. The method of claim 18, further comprising forming a second spacer structure lying between the second gate electrode and the third portion of the channel region of the second semiconductor fin, wherein at least part of the fourth portion of the channel region of the second semiconductor fin extends beyond the height of the second spacer structure.

* * * * *